United States Patent
Kilani et al.

(10) Patent No.: US 7,277,510 B1
(45) Date of Patent: Oct. 2, 2007

(54) ADAPTATION ALGORITHM BASED ON SIGNAL STATISTICS FOR AUTOMATIC GAIN CONTROL

(75) Inventors: Mehdi Tavassoli Kilani, Mississauga (CA); Ayal Shoval, Thornhill (CA)

(73) Assignee: Maxim Integrated Products, Inc., Sunnyvale, CA (US)

( * ) Notice: Subject to any disclaimer, the term of this patent is extended or adjusted under 35 U.S.C. 154(b) by 963 days.

(21) Appl. No.: 09/942,298

(22) Filed: Aug. 29, 2001

Related U.S. Application Data

(60) Provisional application No. 60/291,497, filed on May 16, 2001.

(51) Int. Cl.
H04L 27/08 (2006.01)

(52) U.S. Cl. .................... 375/345; 455/245.1

(58) Field of Classification Search ........... 375/316, 375/345; 455/232.1, 234.1, 234.2, 235.1, 455/249.1, 250.1, 240.1, 245.1; 330/129, 330/254

See application file for complete search history.

(56) References Cited

U.S. PATENT DOCUMENTS

| | | | |
|---|---|---|---|
| 4,807,167 A | 2/1989 | Green, Jr. | |
| 4,829,593 A | 5/1989 | Hara | |
| 5,036,527 A | 7/1991 | Halim et al. | |
| 5,051,707 A | 9/1991 | Fujita | |
| 5,117,201 A | 5/1992 | Luther | |
| 5,208,842 A * | 5/1993 | Atwood et al. ............... 377/55 |
| 5,563,916 A * | 10/1996 | Scarpa ........................ 375/345 |
| 5,566,201 A | 10/1996 | Ostman | |
| 5,620,466 A | 4/1997 | Haefner et al. | |
| 5,650,784 A | 7/1997 | Hikosaka et al. | |
| 5,659,582 A * | 8/1997 | Kojima et al. .............. 375/345 |
| 5,828,692 A | 10/1998 | Walley | |
| 5,955,925 A | 9/1999 | Segawa et al. | |
| 5,987,075 A * | 11/1999 | Abe et al. .................... 375/334 |
| 6,195,133 B1 | 2/2001 | Bae | |
| 6,668,027 B1 * | 12/2003 | Scarpa ........................ 375/345 |
| 6,870,891 B2 * | 3/2005 | Wu et al. .................... 375/345 |

OTHER PUBLICATIONS

Fertner et al, "An adaptive gain control with a variable step size for use in high-speed data communication system," IEEE Transanctions on Circuits and Systems, vol. 44, Nov. 1997, pp. 962-966.*

Tavares, G.N.; Piedade, M.S. High performance algorithms for digital signal processing AGC; Circuits and Systems, 1990., IEEE International Symposium on, 1990 pp. 1529-1532 vol. 2.

Fujii, M.; Kawaguchi, N.; Nakamura, M. ; Ohsawa, T. Feedforward and Feedback AGC for fast fading channels. Electronic Letters, vol. 31, Issue 13, Jun. 22, 1995, pp. 1029-1030.

Ramirez-Barajas, J.; Dieck-Assad, G.; Soto, R. A Fuzzy logic based AGC algorithm for a radio communication system. Fuzzy Systems, 2000. FUZZ IEEE 2000. The Ninth IEEE International Conference on, vol. 2, 2000, pp. 977-980 vol. 2.

\* cited by examiner

*Primary Examiner*—Kevin Kim
(74) *Attorney, Agent, or Firm*—Blakely Sokoloff Taylor Zafman LLP

(57) ABSTRACT

An adaptation process for automatic gain control is adapted to obtains the statistical characteristics of the received signal to estimate the input signal power level. The estimated input signal power level is used to adjust the gain of a variable gain amplifier for the automatic gain control.

22 Claims, 3 Drawing Sheets

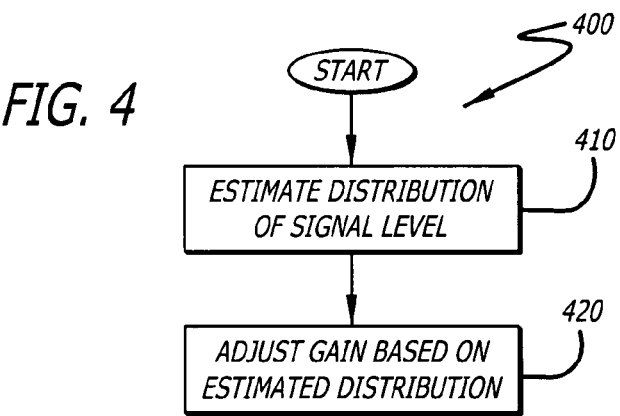
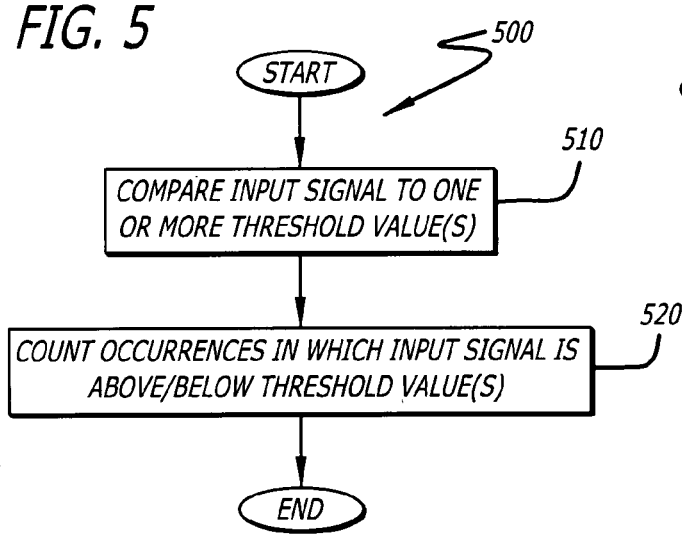
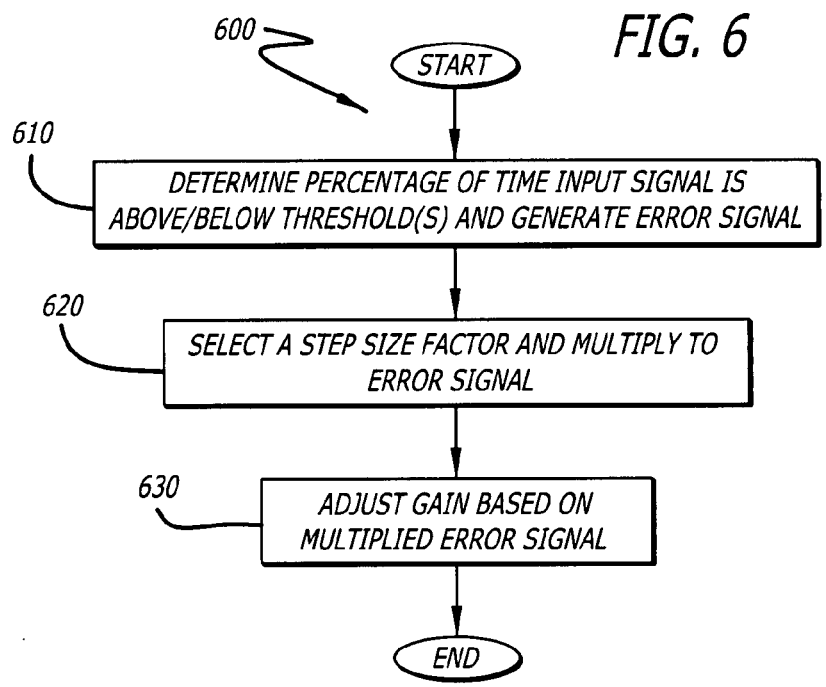

ADAPTATION ALGORITHM BASED ON SIGNAL STATISTICS FOR AUTOMATIC GAIN CONTROL

RELATED APPLICATIONS

This application claims the benefit of U.S. Provisional Application No. 60/291,497 filed May 16, 2001.

BACKGROUND OF THE INVENTION

1. Field of the Invention

The invention relates to communication systems and more particularly to an automatic gain control method and devices for communication system receivers.

2. Description of the Related Art

Automatic gain control (AGC) is used in communication systems to maintain a constant level of output signal when the level of input signal fluctuates. The conventional AGC apparatus detects an error between the input signal level and a given target value. A feedback loop is then used to vary the attenuation factor or the gain of a variable amplifier to reduce the detected error to maintain the output signal level at the target value.

Particularly, in communication receivers, the AGC keeps the signal strength within a predefined limit. For this purpose, an adaptation algorithm can be employed to increase or decrease the gain based on the received signal power. Accordingly, the input analog signal level should be estimated to adjust the gain. Also, the adaptation process needs to converge within a short period of time as well as to provide the required accuracy for the signal level.

Existing algorithms typically use a multi-bit Analog to Digital (A/D) Converter to digitize the input signal received in analog format. The digitized signal goes through a square function and is low pass filtered. The filtered output is then squared rooted to obtain an estimate of the analog signal level. However, using multi-bit blocks such as an A/D Converter, multiplier, square root function and low pass filter, require a complex hardware implementation, increasing the cost and limiting the processing speed. Moreover, the information regarding the nature of the signal is not taken into account in estimating the analog signal level.

BRIEF SUMMARY OF THE INVENTION

The invention provides a novel adaptation technique to estimate the received signal power. The programmability feature allows a designer to meet the required trade off between the acquisition time and the accuracy. Also, the hardware can be implemented fully in the digital domain without requiring analog power estimators, an Analog to Digital (A/D) Converter or a digital low pass filter which is typically employed to estimate signal power.

Particularly, the present technique utilizes the statistical characteristics of the received signal and provides an estimate of the signal power according to the amplitude probability distribution. This results in a computationally simple hardware structure which replaces a multi-bit A/D Converter by a simple comparator to obtain an accurate estimate of the input signal power.

BRIEF DESCRIPTION OF THE DRAWINGS

The invention will be described in detail with reference to the following drawings in which like reference numerals refer to like elements wherein:

FIG. 4 is a first embodiment of the adaptation method.

FIG. 5 is an embodiment of a method for estimating the distribution.

FIG. 6 is a second embodiment of the adaptation method.

DETAILED DESCRIPTION

In the following description, numerous specific details are set forth to provide a thorough understanding of the invention. For example, some circuits are shown in block diagram in order not to obscure the present invention in unnecessary detail. However, it will be understood by those skilled in the art that the present invention may be practiced without such specific details.

Herein, the term "machine readable medium" includes, but is not limited to portable or fixed storage devices, optical storage devices, and any other devices capable of storing instructions and/or data. The term "instructions" refers to a single instruction or a group of instructions, and may be one or a combination of software and firmware including data, codes, and programs that can be read and/or executed to perform certain tasks.

Generally, a communication system includes a transmitter which may transmit information to a receiver using an analog signal. However, because the level of the input signal received can fluctuate, the receiver includes an automatic gain control (AGC) unit to maintain a constant power level or amplitude of input signal for processing. A typical AGC unit detects an error between the input signal level and a given target level, varies the attenuation factor or the gain of a variable amplifier based upon the error signal, and uses a feedback loop to control the signal level. By appropriately increasing and decreasing the gain, the signal strength can be kept within a predefined limit.

Figure 1:
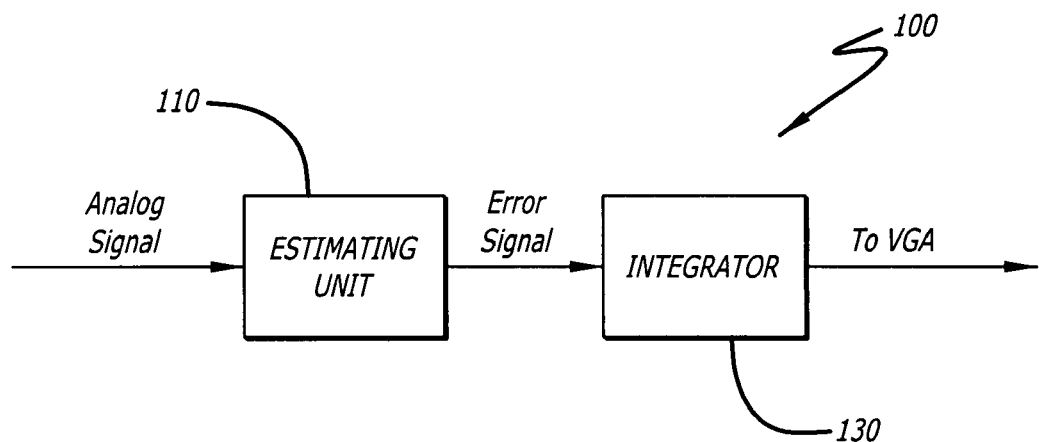
FIG. 1 is a block diagram of an automatic gain control in accordance with one embodiment of the present invention.

The invention allows a simple and low cost adaptation process for AGC by estimating the signal power via a statistical method. FIG. 1 shows an exemplary AGC unit 100 in accordance with one embodiment of the invention. The AGC 100 unit includes an estimating unit 110 to estimate a distribution of the input analog signal power amplitude, and an integrator 130 to adjust the gain of a variable gain amplifier (VGA) based upon the distribution.

Figure 2:
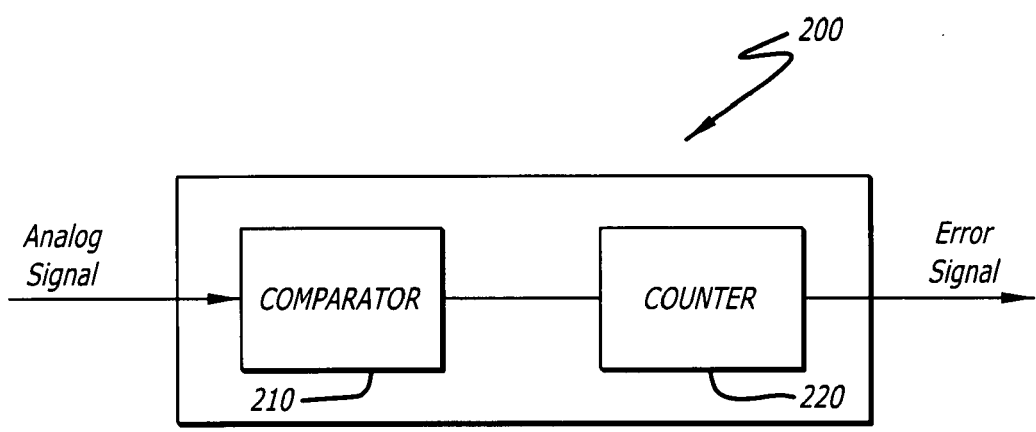
FIG. 2 is an example embodiment of an automatic gain control device in accordance with the present invention.

FIG. 2 shows one embodiment of an estimating unit 200 to obtain the statistical characteristics of the received signal for estimating the input signal power. Referring to FIG. 2, a comparator 210 compares the input analog signal against one or more reference thresholds. Here, the reference thresholds may be set to Nyquist or higher rate. The occurrences in which the input signal is above (and/or below) the threshold(s) within a given time window is then counted by a counter 220. The counting gives an estimated probability distribution of the input signal power amplitude. Depending on the threshold and the ratio of the time during which the input signal is above (and/or below) the threshold(s), an estimate of the error signal (the difference between the current signal power and the desired value) can be obtained.

The error signal generated by the estimating unit 200 is used in a feedback loop of an integrator to adjust the gain for AGC. One embodiment in particular uses gear shifting to increase the speed of adaptation process when the error is large and to increase the accuracy when the error is small (e.g. near convergence). Gear shifting may be employed by setting a digital comparator which looks at the magnitude of the number of occurrences in which the input signal level, namely the input signal envelope, is either above and/or below the threshold(s) within the time window. If the number of occurrences is higher than a predetermined value then a large step size for the adaptation is chosen.

Figure 3:
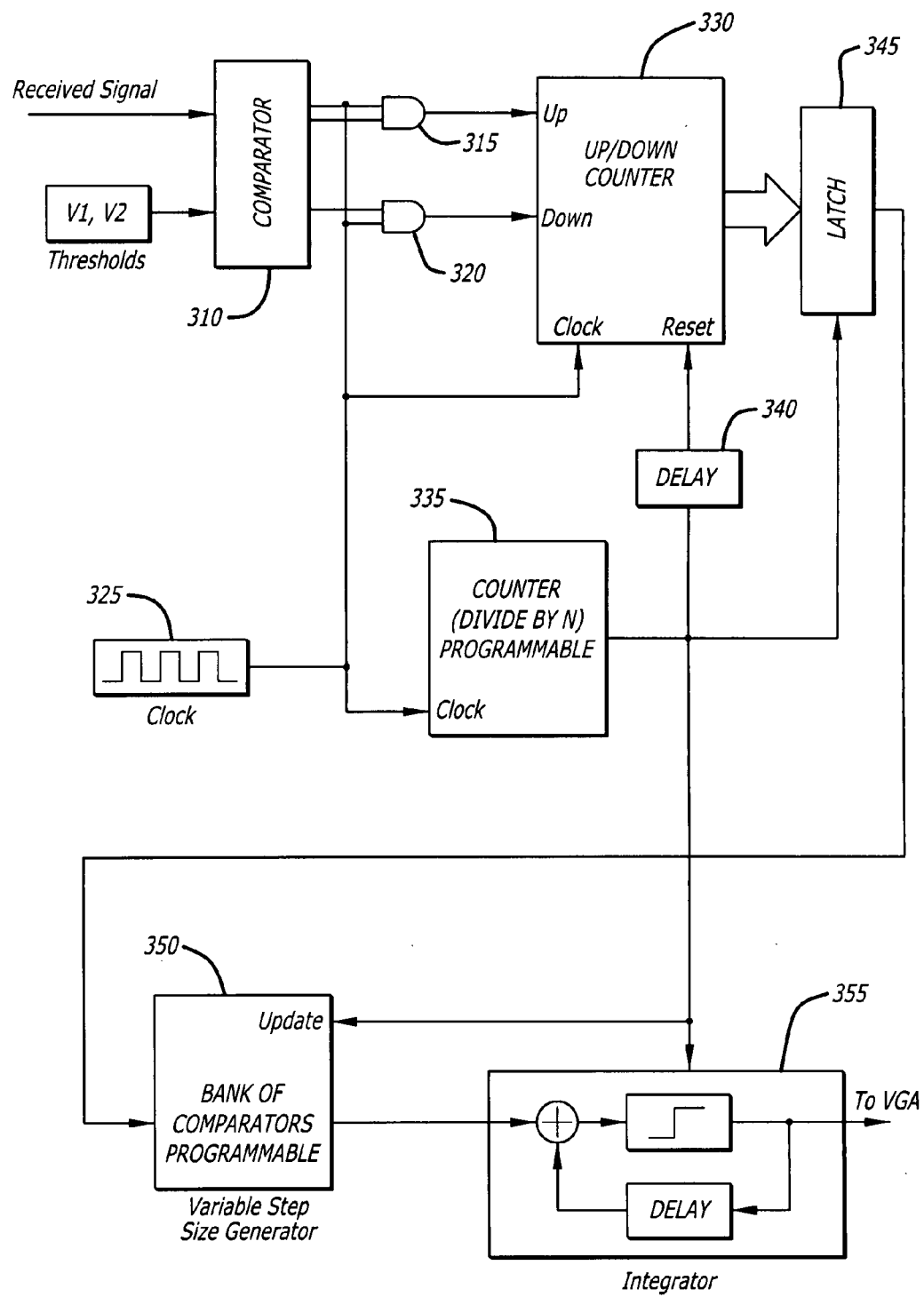
FIG. 3 is an exemplary implementation of the adaptation technique.

An example implementation of the adaptation technique in accordance with one embodiment of the invention is shown in FIG. 3. As shown, a comparator 310 receives and compares the input analog signal against two threshold values V1 and V2. At a sampling rate determined by a clock 325, the up/down counter 330 counts the number of times the input signal level exceeds the thresholds within a predetermined period. In the embodiment, the up/down counter 330 increases a count value when the output signal of an AND gate 315 is high and decreases the count value when the output signal of an AND gate 320 is high. Namely, the comparator 310 is set to output a high signal to the AND gate 315 if the input signal exceeds the threshold value V1 and is set to output a high signal to the AND gate 320 if the input signal is below the threshold value V2. The clock 325 gates the outcome of the AND gates on the clock signal.

Accordingly, the up/down counter 330 estimates the signal level by measuring the ratio percentage of times during the predetermined period that the input signal exceeds the threshold limits set by V1 and V2, and provides an error signal to a variable step size generator 350. Here, a programmable counter 335 resets the up/down counter 330 through a delay 340 and controls a latch 345 to output the error signal after each predetermined period. Depending on the value of the error signal, a step size factor is selected by the variable step size generator 350. The error signal is then multiplied by the step size factor and is output to an integrator 355. The integrator 355 accumulates the error signals from the variable step size generator 350 through an integrating loop and outputs a signal to adjust the gain of a VGA for adaptation.

Accordingly, the adaptation process in accordance with the invention utilizes the statistical characteristics of the received signal, for example the percentage of times the input signal exceeds the threshold values, and provides an estimate of the signal power according to the amplitude probability distribution. This results in a computationally simple hardware implementation which replaces a multi-bit A/D Converter by a simple comparator to obtain an accurate estimate of the signal power. Namely, the invention allows a fully digital implementation for fast and accurate power estimation without the need of an A/D Converter, a multi-bit multiplier or digital low pass filter.

Note above that the comparator 310 can output appropriate signals to the up/down counter 330 to count the occurrences that the input signal exceeds the threshold limits through means other than AND gates. Accordingly, the invention is not limited to the AND gates. For example, the comparator 310 and the up/down counter 330 can be set to count the number of times the input signal does not exceed the threshold limits. It will be apparent to those skilled in the art that the teachings of the invention can be applied in a variety of other ways.

FIG. 4 shows an adaptation method 400 in accordance with one embodiment of the invention. The adaptation method 400 begins by estimating a distribution of input signal level or power amplitude (block 410). The gain for ACG is then adjusted based upon the estimated distribution (block 420).

The distribution of the input signal level can be obtained using any method and implemented using software, firmware, hardware or any combination thereof. FIG. 5 shows one method 500 in accordance with the invention to estimate the distribution. The method 500 compares the input analog signal against one or more reference threshold values (block 510). The distribution of the input signal level is estimated by counting the occurrences in which the input analog signal is either above or below the one or more reference threshold values within a given period (block 520). For example, the input analog signal may be compared against a first reference threshold value and a second threshold value. In such case, the occurrences in which the input analog signal is above the first reference threshold value and occurrences in which the input analog signal is below the second reference threshold value are counted.

Here, if the first reference threshold value is higher than the second reference threshold value, the counting goes up when the input analog signal is above the first reference threshold value and goes down when the input analog signal is below the second reference threshold value. In an alternative embodiment, the counting may go down when the input analog signal is above the first reference threshold value and go up when the input analog signal is below the second reference threshold value.

FIG. 600 shows another adaptation method 600 in accordance with the invention. The method 600 determines a percentage of time that the input signal is either above or below the one or more reference threshold values within a given period, and generates an error signal (block 610). Here, the error signal is the ratio percentage of times during the given period that the input signal exceeds the threshold limit(s). Also, as in the method 500, two reference threshold values may be used. A step size factor is then selected based upon the error signal and is multiplied with the error signal to generate a variable error signal (block 620). A large step size factor is selected if the error signal is above a predetermined value. The gain for AGC is adjusted using the variable error signal (block 630). In the adaptation method 600, the speed for adjusting the gain of AGC is varied by gear shifting based upon the distribution of the input signal. The foregoing embodiments are merely exemplary and are not to be construed as limiting the present invention. The present teachings can be readily applied to other types of apparatuses. The description of the present invention is intended to be illustrative, and not to limit the scope of the invention. Many alternatives, modifications, and variations will be apparent to those skilled in the art. For example, it may be possible to implement the present invention or some of its features in hardware, firmware, software or a combination thereof where the software is provided in a processor readable storage medium such as a magnetic, optical, or semiconductor storage medium.

What is claimed is:

1. An apparatus comprising:
   an estimating unit to estimate a distribution of input signal envelope, the estimating unit comprises
      a comparator to compare the input signal envelope against a first reference threshold value and a second reference threshold value, and
      a counter to estimate the distribution by counting occurrences in which the input signal envelope is either above or below the one or more reference threshold values within a given period, the counter to count occurrences in which the input signal envelope is above the first reference threshold value and occurrences in which the input signal envelope is below the second reference threshold value;
an integrator to adjust a gain based upon the distribution for an automatic gain control; and
a variable step size generator to vary the speed by which the integrator adjusts the gain by gear shifting based upon the distribution.

2. The apparatus of claim 1, wherein the first reference threshold value is higher than the second reference threshold value.

3. The apparatus of claim 2, wherein the counter counts up when the input signal envelope is above the first reference threshold value and counts down when the input signal envelope is below the second reference threshold value.

4. The apparatus of claim 1, wherein the integrator adjusts the gain based upon the occurrences counted during the given period.

5. An apparatus comprising:
an estimating unit to estimate a distribution of input signal level, the estimating unit further comprises a variable step size generator;
an integrator to adjust a gain based upon the distribution for an automatic gain control;
a comparator to compare the input signal against one or more reference threshold values; and
a counter to estimate the distribution by counting occurrences in which the input signal level is either above or below the one or more reference threshold values within a given period, wherein
the counter to determine a percentage of time that the input signal level is either above or below the one or more reference threshold values within the given period, and generates an error signal,
the variable step size generator to select a step size factor based upon the error signal and to multiply the error signal with the selected step size factor to generate a variable error signal, and
the integrator to adjust the gain in accordance with the variable error signal.

6. The apparatus of claim 5, wherein the variable step size generator selects a large step size factor if the error signal is above a predetermined value.

7. A method comprising:
estimating a distribution of input signal envelope includes
comparing the input signal envelope against a first reference threshold value and a second reference threshold value, and
estimating the distribution by counting occurrences in which the input signal envelope is above the first reference threshold value and occurrences in which the input signal envelope is below the second reference threshold value within a given period;
adjusting a gain based upon the distribution for an automatic gain control; and
varying the speed by which the gain is adjusted by gear shifting based upon the distribution.

8. The method of claim 7, wherein the first reference threshold value is higher than the second reference threshold value.

9. The method of claim 8, wherein counting up when the input signal envelope is above the first reference threshold value and counting down when the input signal envelope is below the second reference threshold value.

10. The method of claim 7, wherein adjusting the automatic gain control based upon the occurrences counted during the given period.

11. A method comprising:
estimating a distribution of input signal level, estimating the distribution comprises:
determining a percentage of time that the input signal level is either above or below one or more reference threshold values within a given period, and generating an error signal;
selecting a step size factor based upon an error signal and multiplying the error signal with a selected step size factor to generate a variable error signal; and
adjusting a gain in accordance with the variable error signal;
estimating the distribution by counting occurrences in which the input signal level is either above or below the one or more reference threshold values within the given period including comparing the input signal level against a first reference threshold value and a second reference threshold value, and counting occurrences in which the input signal level is above the first reference threshold value and occurrences in which the input signal level is below the second reference threshold value.

12. The method of claim 11, wherein selecting a large step size factor if the error signal is above a predetermined value.

13. An instruction loaded in a machine readable medium comprising:
a first group of instructions to estimate a distribution of input signal envelope;
a second group of instruction to adjust a gain based upon the distribution for an automatic gain control;
a third group of instructions to compare the input signal envelope against one or more reference threshold values including a comparison of the input signal envelope against a first reference threshold value and a second reference threshold value; and
a fourth group of instructions to estimate the distribution by counting occurrences in which the input signal envelope is either above or below the one or more reference threshold values within a given period, the fourth group of instructions include instructions to count occurrences in which the input signal envelope is above the first reference threshold value and occurrences in which the input signal envelope is below the second reference threshold value; and
a fifth group of instructions to vary the speed by which the gain is adjusted by gear shifting based upon the distribution.

14. Instructions loaded in a machine readable medium comprising:
a first group of instructions to estimate a distribution of input signal envelope, the first group of instructions further comprises a fifth group of instructions;
a second group of instruction to adjust a gain based upon the distribution for an automatic gain control;
a third group of instructions to compare the input signal envelope against one or more reference threshold values including a comparison of the input signal envelope against a first reference threshold value and a second reference threshold value; and
a fourth group of instructions to estimate the distribution by counting occurrences in which the input signal envelope is either above or below the one or more reference threshold values within a given period, the fourth group of instructions include instructions to count occurrences in which the input signal envelope is above the first reference threshold value and occurrences in which the input signal envelope is below the second reference threshold value, and wherein:

the fourth group of instructions to determine a percentage of time that the input signal envelope is either above or below the one or more reference threshold values within the given period, and generating an error signal;

the fifth group of instructions to select a step size factor based upon the error signal and to multiply the error signal with the selected step size factor to generate a variable error signal; and the second group of instructions to adjust the gain in accordance with the variable error signal.

15. A communication system comprising:

a transmitter to transmit an analog signal;

a receiver to receive the analog signal, the receiver including an automatic gain control unit to maintain a constant level of the analog signal for processing in the receiver, the automatic gain control unit including:

an estimating unit to estimate a distribution of input signal envelope, the estimating unit comprises (i) a comparator to compare the input signal envelope against a first reference threshold value and a second reference threshold value, and (ii) a counter to estimate the distribution by counting occurrences in which the input signal envelope is either above or below the one or more reference threshold values within a given period, the counter counts occurrences in which the input signal envelope is above the first reference threshold value and occurrences in which the input signal envelope is below the second reference threshold value;

an integrator to adjust a gain based upon the distribution for the automatic gain control; and a variable step size generator to vary the speed by which the integrator adjusts the gain by gear shifting based upon the distribution.

16. The communication system of claim 15, wherein the first reference threshold value is higher than the second reference threshold value.

17. A communication system comprising:

a transmitter to transmit an analog signal;

a receiver to receive the analog signal, the receiver including an automatic gain control unit to maintain a constant level of the analog signal for processing in the receiver, the automatic gain control unit comprises:

an estimating unit to estimate a distribution of input signal level, the estimating unit comprises a comparator to compare the input signal level against one or more reference threshold values and a counter to estimate the distribution by counting occurrences in which the input signal level is either above or below the one or more reference threshold values within a given period an integrator to adjust a gain based upon the distribution for the automatic gain control, and a variable step size generator, and wherein:

the counter determines a percentage of time that the input signal level is either above or below the one or more reference threshold values within the given period, and generate an error signal;

the variable step size generator selects a step size factor based upon the error signal and multiplies the error signal with the selected step size factor to generate a variable error signal; and the integrator adjusts the gain in accordance with the variable error signal.

18. An automatic gain control apparatus comprising:

a comparator to compare input signal level for an envelope of an input signal against one or more reference threshold values, the comparator to compare the input signal level against a first reference threshold value and a second reference threshold value;

a counter to count occurrences in which the input signal level is either above or below the one or more reference threshold values within a given period, the counter to count occurrences in which the input signal level is above the first reference threshold value and occurrences in which the input signal level is below the second reference threshold value;

an integrator to adjust a gain for automatic gain control, the gain adjusted based upon the occurrences counted; and a variable step size generator to vary how the integrator adjusts the gear shifting based upon the distribution.

19. The apparatus of claim 18, wherein the first reference threshold value is higher than the second reference threshold value.

20. The apparatus of claim 19, wherein the counter counts up when the input signal level is above the first reference threshold value and counts down when the input signal level is below the second reference threshold value.

21. An apparatus comprising:

a comparator to compare input signal level against one or more reference threshold values;

a counter to count occurrences in which the input signal level is either above or below the one or more reference threshold values within a given period, to determine a percentage of time that the input signal level is either above or below the one or more reference threshold values within the given period, and to generate an error signal; and a variable step size generator to select a step size factor based upon the error signal and multiplies the error signal with the selected step size factor to generate a variable error signal; and an integrator to adjust a gain for automatic gain control in accordance with the variable error signal.

22. A method for automatic gain control comprising:

comparing input signal level associated with an envelope of an input signal against a first reference threshold value and a second reference threshold value;

counting occurrences in which the input signal level is either above or below the one or more reference threshold values within a given period by counting occurrences in which the input signal level is above the first reference threshold value and occurrences in which the input signal level is below the second reference threshold value;

adjusting a gain for automatic gain control based upon the occurrences counted; and varying the speed by which the gain is adjusted by gear shifting based upon the distribution.

* * * * *